United States Patent [19]

Niijima

[11] Patent Number: 4,789,945

[45] Date of Patent: Dec. 6, 1988

[54] METHOD AND APPARATUS FOR CHARGED PARTICLE BEAM EXPOSURE

[75] Inventor: Hironobu Niijima, Tatebayashi, Japan

[73] Assignee: Advantest Corporation, Tokyo, Japan

[21] Appl. No.: 889,866

[22] Filed: Jul. 28, 1986

[30] Foreign Application Priority Data

Jul. 29, 1985 [JP] Japan .................... 60-168048

[51] Int. Cl.$^4$ ........................ H01J 37/302
[52] U.S. Cl. .................. 364/490; 364/489; 364/491; 250/398; 250/491.1; 250/492.2
[58] Field of Search ........... 364/490, 491, 571, 488, 364/489; 250/398, 491.1, 492.2, 396 R, 492.3, 492.22

[56] References Cited

U.S. PATENT DOCUMENTS

| | | | |
|---|---|---|---|
| 4,130,761 | 12/1978 | Matsuda | 250/398 |
| 4,322,626 | 3/1982 | Kawashima | 250/492.2 |
| 4,443,703 | 4/1984 | Shimazu et al. | 250/491.1 |
| 4,489,241 | 12/1984 | Matsuda et al. | 250/491.1 |
| 4,511,980 | 4/1985 | Watanabe | 250/398 |
| 4,558,225 | 12/1985 | Gotou et al. | 250/491.1 |
| 4,585,943 | 4/1986 | Yasuda et al. | 250/396 ML |
| 4,586,141 | 4/1986 | Yasuda et al. | 364/490 |
| 4,625,121 | 11/1986 | Hamaguchi | 250/492.2 |
| 4,644,170 | 2/1987 | Komatsu | 250/398 |
| 4,647,782 | 3/1987 | Wada et al. | 250/398 |

Primary Examiner—Parshotam S. Lall
Assistant Examiner—V. N. Trans
Attorney, Agent, or Firm—Staas & Halsey

[57] ABSTRACT

A method and apparatus for drawing, by an electron beam, patterns on a semiconductor wafer for fabricating of an integrated circuit. Chip areas on the semiconductor wafer are each divided into rectangular blocks arrayed in rows and columns. The deflection field of the electron beam is selected slightly larger than each block. Real block marks, indicating the positions of respective blocks, are provided on every side of the chip area. The specimen is fed so that a block array starting at one corner of the chip area passes through the deflection field along one side of the array. Upon detecting the block marks at three corners of a first block of the array, correction coefficients for the block are computed based on the positions of the three detected real block marks and then an imaginary block mark is set at the remaining corner of the block on the basis of the correction coefficients. Thereafter, upon each detection of one real block mark for each block of the block array, correction coefficients are computed based on the position of the newly detected real block mark, the position of the real block mark detected for the immediately preceding block, and the position of the imaginary block mark set for the immediately preceding block. An imaginary block mark is set for the block on the basis of the correction coefficients. Pattern data for each block is corrected according to the correction coefficients thus obtained and a pattern is drawn in the block in accordance with the corrected pattern data.

11 Claims, 8 Drawing Sheets

METHOD AND APPARATUS FOR CHARGED PARTICLE BEAM EXPOSURE

BACKGROUND OF THE INVENTION

The present invention relates to a method and apparatus for charged particle beam exposure, and more particularly to a method and apparatus for drawing various patterns on a semiconductor wafer with a charged particle beam in the manufacture of semiconductor integrated circuits, for example.

It has been proposed, in a view of enhancement in the integration density of semiconductor integrated circuits, to use a charged particle beam such as an electron beam for drawing required circuit patterns on a semiconductor wafer, instead of using a conventional optical exposure technique. Since the patterns exposed through electron beam deflection include deflection distortions, it has been conventional to correct pattern data to be applied to the electron beam deflector.

In the manufacture of semiconductor integrated circuits the formation of each circuit pattern on the semiconductor wafer calls for a series of steps such as drawing of the pattern on the wafer, development of the exposed pattern, diffusion of an impurity into the wafer, etc.; namely, the fabrication of the semiconductor integrated circuits includes a plurality of pattern drawing steps. Some of these fabrication steps involve heating of the semiconductor wafer, which often leads to warping or deformation of the wafer by heat. If patterns as originally designed were exposed on such a warped or deformed semiconductor wafer even with an electron beam compensated for deflection distortion, their lines would become thin or close together, or pattern misalignment would occur between successive steps, making it impossible to obtain an intended semiconductor integrated circuit. This constitutes a serious obstacle to the fabrication of high density integrated circuits, in particular.

Fujinami et al discloses possibility of high precision pattern exposure through compensation for pattern distortions resulted from the deflection distortions and wafer warping in the literature entitled "PRECISION REGISTRATION METHOD FOR 0.5 $\mu$m ELECTRON BEAM LITHOGRAPHY", IEDM 81, IEEE 1981, pp. 566–569. According to Fujinami et al, however, a set of correction coefficients are determined for each block which includes a plurality of chip areas, it is not possible to determine correction coefficients for smaller regions in each chip area.

As a solution to this problem, the following improvement has been proposed for the charged particle beam exposure process.

For example, assuming that 50 chip areas 10 are present on the top surface of a semiconductor wafer 11 as shown in FIG. 1, block marks 102A, 102B, 102C and 102D for defining the position of each chip area 10 are formed at four corners thereof by forming grooves in the wafer surface. Further, wafer marks 120-1 and 120-2 are similarly provided for indicating the reference position of the semiconductor wafer 11. The drawing of a pattern on the semiconductor wafer 11 starts with the detection of the block marks 102A throgh 102D of the chip area 10 where to expose the pattern, thereby checking alignment errors of the four block marks of the chip area which are resulted from the aforementioned warping or deformation of the semiconductor wafer 11. Then distortion correction coefficients are computed from the detected values of the shifts and design data of the pattern are corrected based on the coefficients, after which a corrected pattern is drawn in the desired chip area 10. With this method, an appreciably high density semiconductor integrated circuit could be produced with high precision even if the semiconductor wafer 11 has been warped or deformed through heating or cooling in each fabrication step.

In such a conventional method, however, since the correction coefficients for each chip area 10 are computed based upon only the four block marks 102A to 102D at the corners of the chip area, it is difficult or almost impossible to correct the pattern with sufficiently high precision throughout the chip area when each chip area 10 is large, in particular, when a high integration density is needed. Incidentally, the block marks cannot be provided inside the chip area since they would hinder the formation of circuits.

Each array of the chip areas 10 in the row direction will hereinafter be referred to as a unit area 104. Each chip area 10 is fictitiously divided into a plurality of smaller areas, four in the illustrated example, along the column direction and an array of such smaller areas in the row direction, as indicated by hatching in FIG. 1, will be called a unit belt 200. The charged particle beam exposure (hereinafter referred to as electron beam exposure because an electron beam is employed in general) for pattern drawing is usually carried out by directing an electron beam to a desired position in a relatively wide main deflection field through main deflection scanning control and deflecting the electron beam around the abovesaid position in a narrow sub-deflection field through sub-deflection scanning control. Let it be assumed that each chip area 10 measures 10 by 10 mm, the main deflection field 2.5 by 2.5 mm, and the sub-deflection field 80 by 80 $\mu$m. In this example, the main deflection field is a square field each side of which is equal to the width of the unit belt 200. Since the designed position data of the block marks 102A through 102D are preknown, a stage carrying the semiconductor wafer 11 is moved so that one of the block marks defining one unit area 104 is supposedly positioned at the center of the main deflection field, which is followed by the sub-deflection scanning with the electron beam, and then the reflected beam is detected, thereby sensing the actual position of the block mark. Likewise, the actual positions of all the other block marks defining the unit area 104 are detected. Then correction coefficients for each chip area 10 in the unit area 104 are computed from the actual block mark positions detected for the chip area and an operation for correcting pattern data to be drawn in the chip area is performed, using the correction coefficients. After this, the main deflection field is brought to one end of one unit belt 200 in the unit area 104 and pattern data for drawing at that position (corrected according to the correction coefficients) is provided for the main and sub-deflection of the electron beam, which is followed by exposure of the semiconductor wafer (deposited over its surface with a photosensitive material layer, in practice) with the electron beam while moving the stage along the unit belt 200. This pattern drawing is carried out for each unit belt.

As will be seen from the above, according to the prior art method, the stage must be moved twice for the detection of the block marks and for the pattern drawing on the semiconductor wafer, so this takes much time as a whole; in some cases, the time for moving the stage acounts for approximately 40% of the total length of time for pattern drawing on the wafer.

As a solution to this problem, it has been proposed in, for instance, Japanese Patent Application Laid Open No. 67627/84, to perform the pattern drawing at the same time as the detection of the block marks. According to this method, the main deflection field is made a little larger than each chip area 10, which is divided into four exposure areas 101A, 101B, 101C, and 101D along the direction of extension of the unit area 104, as depicted in FIG. 2, and block marks 103A, 103B, 103C, . . . are formed on the semiconductor wafer 11 respectively corresponding to four corners of each of the exposing areas 101A to 101D. The stage is moved in the direction indicated by an arrow 105 so that the unit area 104 passes through the main deflection field 106. In this case, when the exposing area 101A enters the main deflection field 106, the positions of the block marks 103A to 103D are detected, the successive positions of deflection of the electron beam are corrected in accordance with the positions of the detected block marks, and patterns 107 and 108 are exposed in the area 101A as the unit area 104 travels. Upon completion of drawing the patterns 107 and 108 in the area 101A, the block marks 103E and 103F of the next exposing area 101B are detected, the successive positions of deflection of the electron beam are corrected on the basis of the detected positions of the newly detected block marks 103E and 103F and the previously detected positions of the block marks 103C and 103D, and then a pattern 109 is exposed in the area 101B.

The time for drawing required patterns on the semiconductor wafer can be reduced by drawing the patterns 107, 108, 109 . . . in the divided areas 101A, 101B, 101C, . . . while continuously feeding the unit belt 104, as described above. This permits the exposure of a number of wafers in a short time.

According to the above electron beam exposure method, however, the main deflection field 106 of the electron beam is selected slightly larger than the chip area 10. With such a large area of the main deflection field 106 of the electron beam, there will develop a deflection distortion or large aberration, impairing the drawing accuracy. Especially when the chip area 10 is large or when the integration density is desired to be increased, the deflection distortion and large aberration of the electron beam constitute an obstacle to the enhancement of the integration density. Moreover, when the chip areas 10 differ in size, it is necessary to change the main deflection field each time, accordingly.

SUMMARY OF THE INVENTION

It is therefore an object of the present invention to provide a charge particle beam exposure method and apparatus which enable to obtain the correction coefficients for each of small areas over the entire chip area and hence permit exposure of patterns with high density.

Another object of the present invention is to provide a charged particle beam exposure method and apparatus which permit pattern exposure with less misalignment in a short time.

The present invention is directed to a charged particle beam exposure method for a specimen in which there is, on its surface, at least one rectangular exposure area to be exposed, the exposure area is vertually divided into rows and columns of blocks and real block marks defining the rows and columns of the blocks are provided along at least two adjoining sides of the rectangular exposure area.

The deflection field of the charged particle beam for the specimen is selected slightly larger than each block. Those blocks bearing real block marks are successively passed through the deflection field. Upon each detection of the real block mark, the correction coefficients for the block concerned are computed based on the actual position of the detected block mark representing one of the four corners of the block, the positions of two real block marks or one real block mark and one imaginary block mark having been obtained at the other two corners of that block, and then the position of an imaginary block mark at the other remaining corner of the block is computed using the correction coefficients thus obtained. Further, pattern data for that block is corrected in accordance with the correction coefficients and a pattern is drawn through charged particle beam which is deflected in accordance with the corrected pattern data.

By setting the imaginary block marks for each block, as described above, the correction coefficients can be obtained even for those blocks that are inside the boundary blocks of the exposure area and therefore have no real block mark, so pattern exposure can be achieved with less misalignment and therefore with high density. In this instance, the pattern drawing can be performed continuously for each row (or column) of blocks after setting imaginary block marks and obtaining correction coefficients for one or more rows of blocks, or simultaneously with the detection of the real block marks, the setting of the imaginary block marks and the computation of the correction coefficients. In the latter case, the specimen is fed continuously, or intermittently for each block. After the imaginary block marks for the respective blocks in the first row having real block marks along one side thereof are set along the opposite side of the row, as described above, similar imaginary block marks are set for respective blocks in the second row. That is, for the first block at one end of the second row, correction coefficients are computed from two real block marks provided at two corners of the first block and one imaginary block mark at another corner which has been set for the first row and an imaginary block mark is set at one remaining corner, using the computed correction coefficients. As for the second block in the second row, correction coefficients are computed from already obtained imaginary block marks at three corners of the block and an imaginary block mark at the remaining corner is set using the correction coefficients. Similarly, imaginary block marks are set and correction coefficients are computed for the subsequent blocks. Also in this case, the pattern drawing can be performed simultaneously with the setting of the imaginary block marks, or after setting the imaginary block marks for all blocks of one row. In a likewise manner, the setting of imaginary block marks, the computation of correction coefficients and the pattern exposure can be done for each of the subsequent block arrays, too.

In the case of applying the above method to the drawing of patterns on a semiconductor wafer, it is possible to achieve high precision alignment of patterns by dividing each chip area on the wafer into the aforementioned rows and columns of blocks.

The charged particle beam exposure apparatus of the present invention is to expose patterns, by a charged particle beam, on a specimen which has the aforesaid block arrays and block marks. The charged particle beam exposure apparatus of the present invention includes a two-dimensionally movable stage for carrying the specimen, means for generating a charged particle beam, means for scanning the specimen with the charged particle beam, block mark detecting means for detecting real block marks on the specimen, correction coefficient computing means for computing correction coefficients for each block on the basis of the positions of three block marks of the block at three corners thereof detected by the block mark detecting means, each of the three block marks being either real or imaginary, imaginary mark operating means for performing an operation for setting an imaginary block mark at one remaining corner of the block through use of the computed correction coefficients, imaginary mark storage means for storing the set imaginary block mark, and pattern drawing control circuit whereby pattern data is corrected in accordance with the computed correction coefficients and the deflection of the charged particle beam by deflection means and the irradiation of the specimen with the charged particle beam are controlled.

BRIEF DESCRIPTION OF THE DRAWINGS

FIG. 4 is a diagram a unit belt 20a and a deflection field 204 immediately before the start of pattern drawing on the unit belt 20a;

DESCRIPTION OF THE PREFERRED EMBODIMENTS

Figure 1:
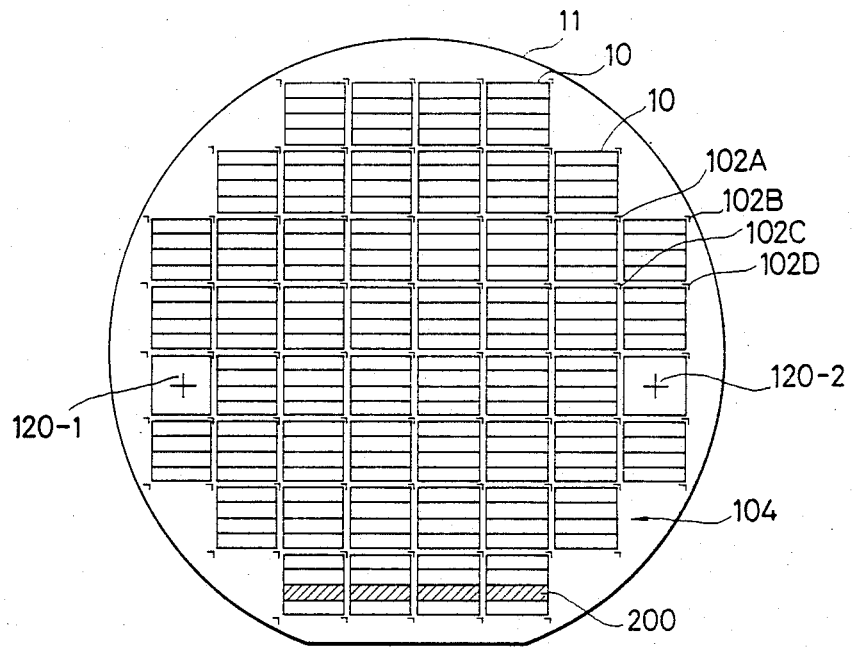
FIG. 1 is a diagram showing chip areas, unit areas 10, and unit belts 104 on a semiconductor wafer 11.
Figure 2:
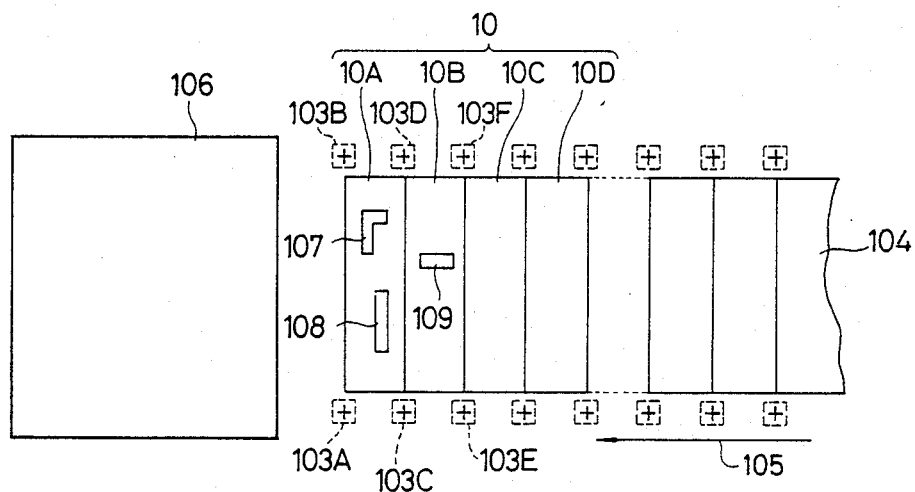
FIG. 2 is a diagram showing unit areas 104 and a deflection field used in a conventional method which performs continuous pattern drawing concurrently with the detection of block marks.
Figure 3:
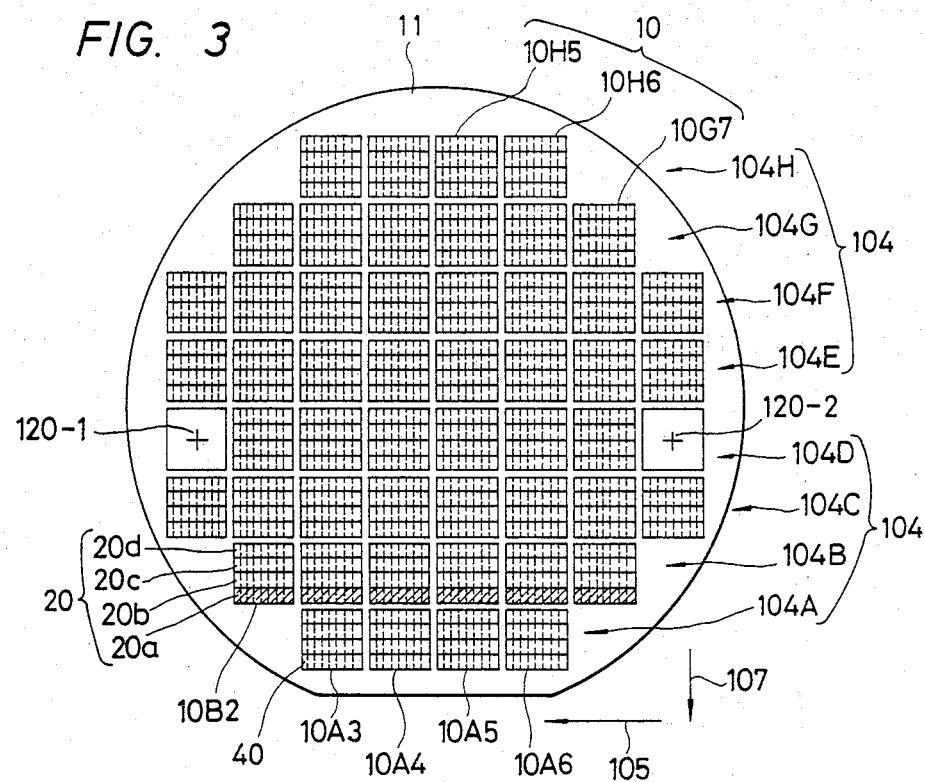
FIG. 3 is a diagram showing chip areas 10, unit areas 104, unit belts 20, and blocks 40 in a semiconductor wafer 11 to which exposure method of the present invention is applied.

The charged particle beam exposure method and apparatus of the present invention will hereinafter be described as being applied to the exposure of patterns on a semiconductor wafer. FIG. 3 shows the case where 50 chip areas 10 and two wafer marks 120-1 and 120-2 are provided in 8 rows (A through H) and 8 columns (1 through 8). The position of each chip 10 may be expressed by affixing the row and column to the numeral 10. Eight unit areas 104 (104A through 104H) are defined on the semiconductor wafer 11 and each unit area 104 is further divided into four unit belts 20 (20a through 20d). Each unit belt 20 of each chip area 10 is subdivided into eight blocks 40 in lengthwise thereof; namely, each chip area 10 is made up of 4 by 8 blocks 40 arranged in a matrix form. A deflection field 204 (FIG. 4) of an electron beam, which can be covered by a combination of main and sub-deflection fields, is selected slightly larger than two blocks. One unit belt 20a is fed through the deflection field 204 in the direction indicated by an arrow 105 and real block marks 22 are detected, while at the same time patterns are exposed. Upon completion of the pattern exposure for the unit belt 20a, the semiconductor wafer 11 is shifted in the direction of an arrow 107 by the width of one unit belt and then pattern exposure is performed while continuously feeding the next unit belt 20b in the direction reverse from the arrow 105. By repeating this operation four times, pattern exposure for one unit area 104 is completed.

Figure 4:
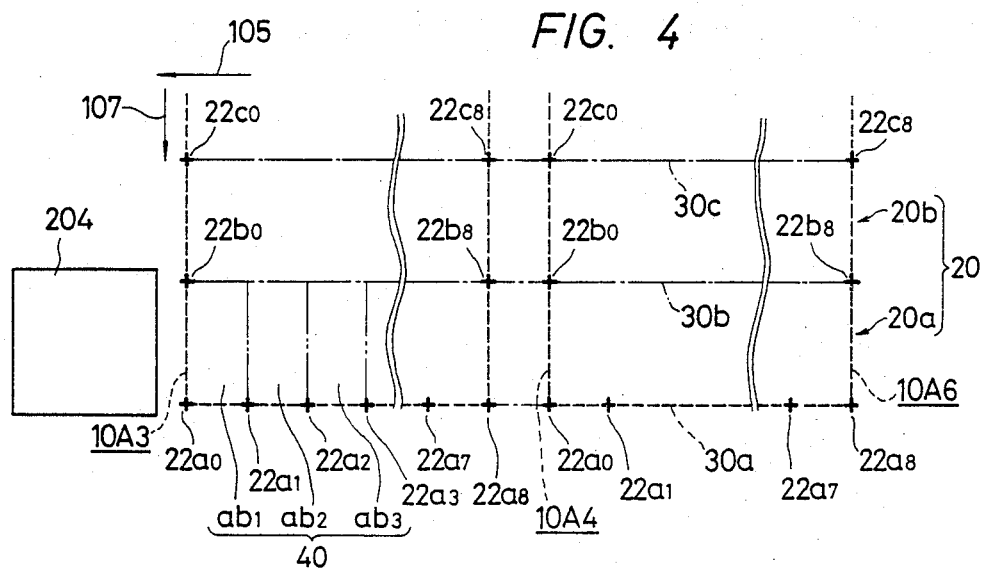

FIG. 4 shows, on an enlarged scale, the leading portion of the unit belt 20a. One longer side 30a of the outermost unit belt 20a is in alignment with one outer margin of the chip area 10A3. The unit belt 200B is an inner unit belt the both longer sides 30b and 30c of which are not in contact with the outer marginal edges of the chip area 10. The unit belt 20a in contact with the outer marginal edge of the chip area 10A3 has real block marks 22a0, 22a1, 22a2, 22a3, ... along its margin for indicating the positions of its blocks. Further, real block marks 22b0 and 22c0 are provided which represent the points of division between the unit belts 20a and 20b and between 20b and 20c, that is, the positions of blocks in the column direction. The real block marks 22a0, 22a1, 22a2, ... and 22b0, 22c0, ... are formed as, for example, cross-shaped grooves in the semiconductor wafer 11.

The width of each of the unit belts 20a to 20d is selected slightly smaller than the length of one side of the deflection field 204 in the column direction of the blocks. The spacing of the real block marks 22a0, 22a1, 22a2, ... which represent the positions of the blocks in the row direction is selected about one-half of the length of one side of the deflection field 204 in the row direction of the blocks. The boundary between the first and second unit belts 20a and 20b is indicated by 30b and the boundary between the second and third unit belts 20b and 20c is indicated by 30c.

Figure 5:
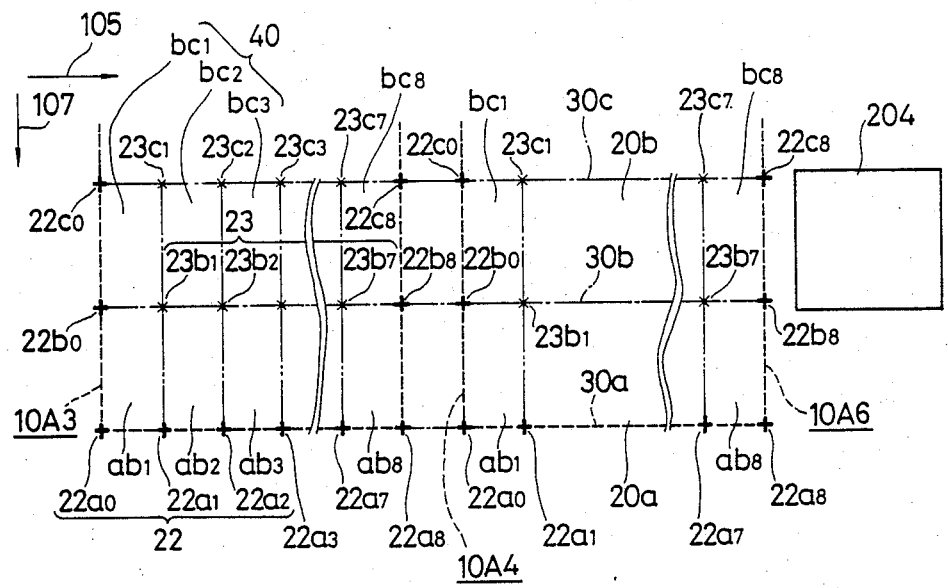
FIG. 5 is a diagram showing, by way of example, the relationship between unit belts 20a and 20b, blocks 40, and imaginary block marks 23.

In the present invention, the positions of imaginary block marks 23b1, 23b2, 23b3, ... are computed and set as indicated in FIG. 5 at the corner positions of respective blocks along the boundary line 30b between the unit belts 20a and 20b on the basis of the positions of the real block marks 22a0, 22a1, 22a2, ... and 22b0, ..., and the position data of the imaginary tlock marks 23b1, 23b2, 23b3, ... are stored. The imaginary block marks 23b1, 23b2, 23b3, ... are used for correction of pattern data, that is, correction coefficients are obtained from the positions of these marks, and corrected patterns are drawn in blocks ab1, ab2, ab3, ... of the first unit belt 20a. Further, the imaginary block marks 23b1, 23b2, 23b3, ... set on the boundary line 30b are utilized as marks for the computation of correction coe-fficients for the respective blocks bc1, bc2, bc3, ..., in the second unit belt 20b. At this time, imaginary block marks 23c1, 23c2, 23c3, ... are determined and set at respective block positions along the boundary line 30c and their position data are stored. When to expose patterns on the unit belt 20b, the patterns are corrected using the stored imaginary block marks 23b1, 23b2, 23b3, ... and 23c1, 23c2, 23c3, ... and corrected patterns are drawn in blocks bc1, bc2, bc3, .... In this way, the pattern correction can be achieved even in the blocks positioned inside the chip area 10, that is, in those blocks in the unit belts 20b and 20c for which real block marks cannot be provided. This ensures higher precision alignment of patterns than in the case of performing it over the entire chip area 10 through utilization of its real block marks at the four corners of the chip area 10 alone, and permits accurate pattern exposure for each block smaller than the chip area 10.

The mark detection and pattern exposure can be simultaneously carried out in such a manner as follows: When one real block mark, for instance, 22a1 has entered the deflection field 204 of the electron beam, correction coefficients are calculated from the detected position of the newly entered mark 22a1 and the known positions of the marks 22a0 and 22b0 to correct pattern data for the block ab1, and pattern exposure is immediately performed, and at the same time the imaginary block mark 23b1 is set at the remaining corner of the block.

A description will be given, with reference to FIGS. 4 through 9, of method for setting the imaginary marks 23b1, 23b2, 23b3, ... and 23c1, 23c2, 23c3, ... and for drawing patterns therein.

FIG. 4 illustrates the state of the first unit belt 20a just before it enters the deflection field 204 of the electron beam. The semiconductor wafer 11 is continuously fed in the direction of the arrow 105.

Figure 6:
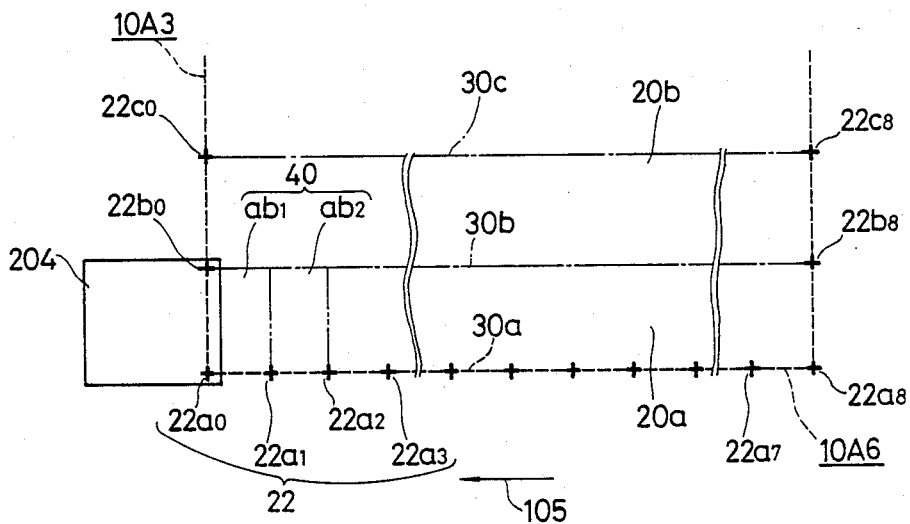
FIGS. 6 through 9 are diagrams, each illustrating examples of the unit belt 20, the deflection field 204 and the imaginary block mark relative to each step for drawing patterns on the unit belt.

FIG. 6 shows the state in which the front of the first unit belt 20a has just entered into the deflection field 204. At this point, the electron beam scans, in a mark detecting mode, regions expected to contain the real block marks 22a0 and 22b0, and their positions are detected by a mark detector.

Figure 7:
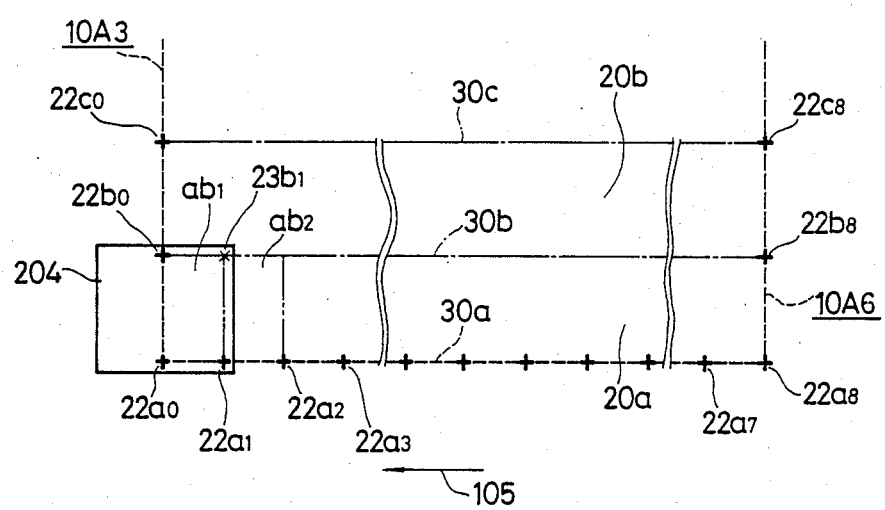

FIG. 7 shows the state in which the real block mark 22a1 has newly entered into the deflection field 204. At this point, the electron beam scans and detects the position of the real block mark 22a1. Thus position data on the three real block marks 22a0, 22a1 and 22b0 are obtained, and correction coefficients ior the block ab1 can be obtained (as described in detail later). Pattern data is corrected in accordance with the correction coefficients, enabling compensation for pattern distortion in the block ab1. Moreover, the position of the remaining unknown corner of the block is computed utilizing the correction coefficients and the computed position is stored as the position of the imaginary block mark 23b1 in an imaginary mark memory unit. The pattern drawing takes place while continuously feeding the semiconductor wafer 11.

Figure 8:
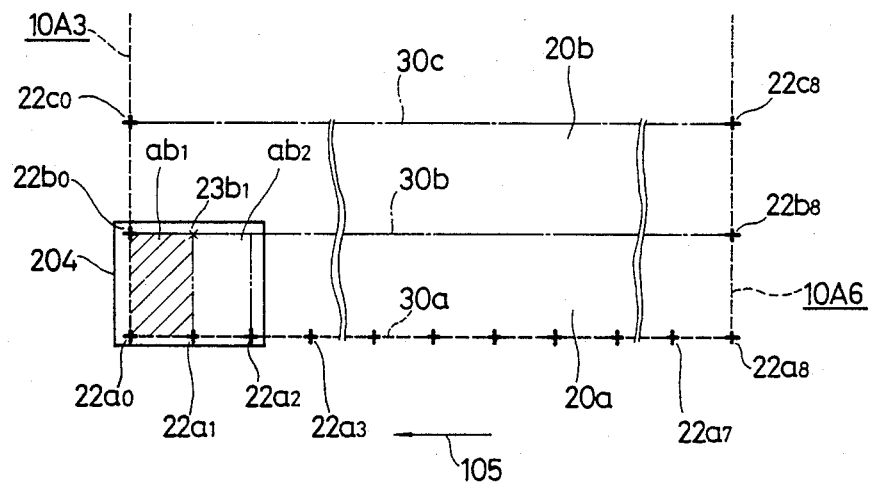
Figure 9:
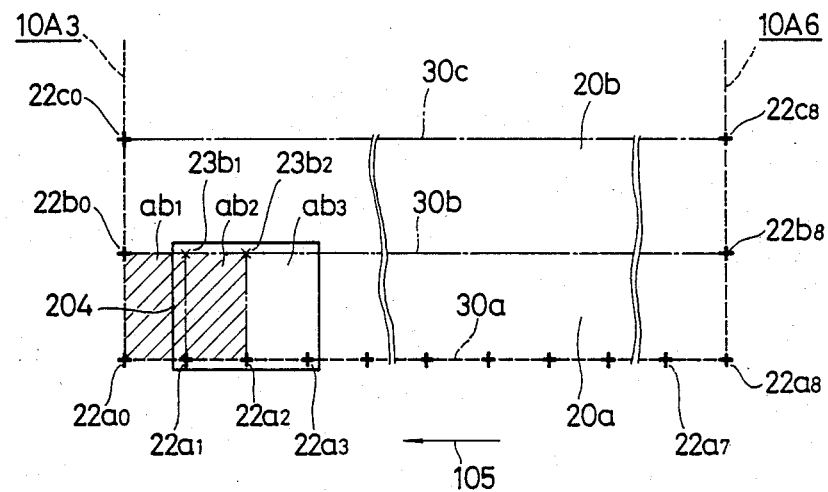

The pattern drawing in the block ab1 is completed while the block ab1 is passing through the deflection field 204 of the electron beam. The hatched portion in FIG. 8 shows a pattern-exposed area. Upon completion of the pattern exposure, the electron beam is switched to the mark detection mode, waiting for the next real block mark 22a2 to enter into the deflection field 204. When the block mark 22a2 enters into the deflection field 204, its position is detected and correction coefficients for the block ab2 is computed using the real block marks 22a1 and 22a2 and the imaginary block mark 23b1. When the correction coefficients have been obtained, a corrected pattern can be drawn in the block ab2. At the same time, the position of the imaginary block mark 23b2 is computed and then stored. FIG. 9 shows the state immediately after the pattern exposure in the block ab2, in which state the real block mark 22a3 is detected.

This operation is repeated for each block of the first unit belt 20a in the chip area 10A3. Each time a new chip area 10 is entered during the pattern exposure for the first unit belt 20a, the correction coefficients for the first block ab1 of the new chip area are computed through use of the real block marks 22a0, 22a1 and 22b0. Whereas, for the last block ab8 of each chip area 10, the correction coefficients may be computed from either a set of two real block marks 22a7, 22a8 and one imaginary block mark 23b7 or a set of three real block marks 22a7, 22a8 and 22b8.

The pattern exposure for the first unit belt 20a is followed by pattern exposure for the second unit belt 20b. As shown in FIG. 5, prior to the pattern exposure, the semiconductor wafer 11 is moved in the direction of the arrow 107 so that the end portion (at the right-hand side in FIG. 5) of the second unit belt 20b lies slightly apart from the left marginal side of the deflection field 204, and then the second unit belt 20b is fed into the deflection field 204 so that at the rightmost block bc8 of each of the successive chip areas 10A6, 10A5, 10A4 and 10A3, correction coefficients for the block bc8 are obtained using the real block marks 22b8 and 22c8 and the imaginary block mark 23b7. At the same time, an imaginary block mark 23c7 is set on the boundary line 30c, as depicted in FIG. 5. The direction of travel of the semiconductor wafer 11 is opposite from the direction in the case of the pattern exposure for the first unit belt 20a. At each of the succeeding blocks bc7 to bc2 in each chip area 10, the correction coefficients and the position of a new imaginary block mark are computed based on data of the associated three imaginary block marks having been obtained. Whereas for the last block (i.e. leftmost block) bc1 in each chip area 10, the correction coefficients may be computed from either a set of two imaginary block marks 23b1, 23c1 and one real block mark 22b0 or a set of two real-block-marks 22b0, 22c0 and one imaginary block mark 23b1. In this way, pattern exposure is performed for the unit belts 20b and 20c. In the case of pattern exposure for the unit belt 20d, since the real block marks 22e0, 22e1, 22e2, ... (not shown) are provided at its outside margin, the correction coefficients for the respective blocks de1, de2, de3, ... are computed using them.

Although in this embodiment the direction of travel of the semiconductor wafer 11 is reversed every unit belt, the wafer may also be fed in one direction for all the unit belts. In such a case, upon completion of the pattern exposure for one unit belt, the stage carrying the semiconductor wafer 11 is returned to a position where the deflection field 204 lies at the front of the next unit belt.

Figure 10:
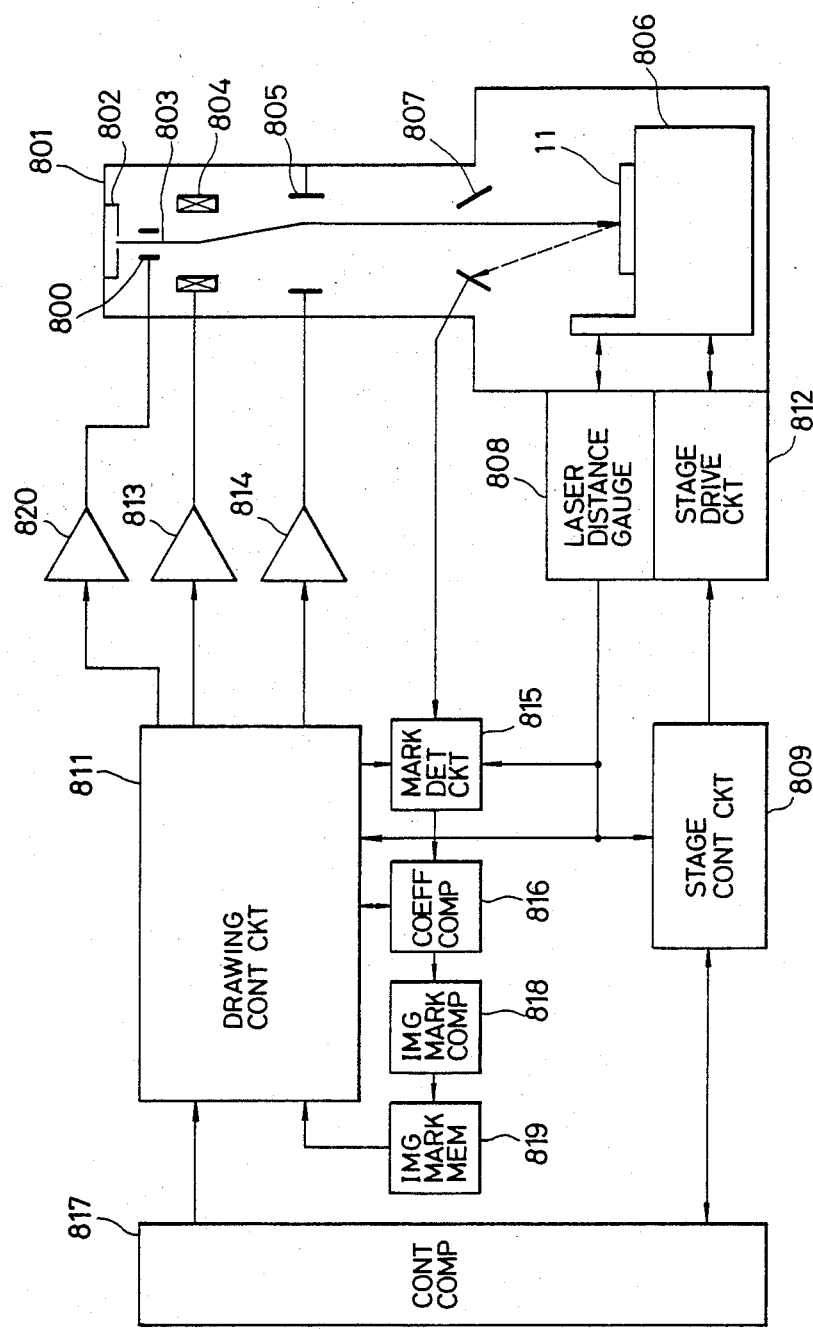
FIG. 10 is a block diagram illustrating an example of the apparatus of the present invention.

FIG. 10 illustrates the arrangement of an electron beam exposure apparatus utilizing the electron beam exposure method described above. In FIG. 10 a column 801 can be evacuated and an electron gun 802 is mounted on the underside of its top panel. The emission of an electron beam 803 from the electron gun 802 is subject to ON-OFF control by a beam blanker 800. The electron beam 803 is deflected to perform so called vector scan under control of a main deflector 804 and a sub-deflector 805 for irradiation of the semiconductor wafer 11 mounted on a stage 806.

A mark detector 807 detects the real block marks 22a0, 22a1, 22a2, ... and 22b0, 22c0, ... on the semiconductor wafer 11, through detection of a change in reflected electrons which are created by the bombardment of the semiconductor wafer 11 by the electron beam 803. A laser distance gauge 808 detects the position of the stage 806 and delivers the detected distance signal to a stage control circuit 809 and a drawing control circuit 811, in which the distance signal is used as position control information for driving the stage 806 and for pattern drawing. A stage drive circuit 812 responds to a control signal from the stage control circuit 809 to shift the stage 806.

A main deflection drive circuit 813 includes a D/A converter and provides a main deflection signal to the main deflector 804. A sub-deflection drive circuit 814 includes a D/A converter and provides a sub-deflection signal to the sub-deflector 805. The deflection drive circuits 813 and 814 are supplied with a corrected main deflection signal and a corrected sub-deflection signal from the drawing control circuit 811, respectively. Based on the main deflection signal and the sub-deflection signal, the electron beam 803 vector-scans the deflection field 204 shown in FIGS. 3 to 8. The deflection field 204 can be set, for instance, such that the electron beam scans an area of 2.5×2.5 mm$^2$ and an area of 80×80 μm$^2$ under control of the main deflector 804 and the sub-deflector 805, respectively. Electromagnetic deflection means, for instance, can be used as the main deflector 804 and, as the sub-deflector 805, electrostatic deflection means can be employed from the viewpoint of its high speed performance.

The mark detection signal from the mark detector 807 is applied to a mark detection circuit 815. The mark detection circuit 815 is supplied with mark position expect signals from the drawing control circuit 811 and the laser distance gauge 808. When the output signal from the mark detector 807 undergoes an abrupt change while the mark detection circuit 815 is being supplied with the mark position expect signals, it decides that a real block mark has been detected, and provides the mark detection signal to a coefficients computing circuit 816.

The coefficients computing circuit 816 computes correction coefficients for each block on the basis of the positions of three block marks of the block, and applies the computed correction coefficients to the drawing control circuit 811. The drawing control circuit 811 corrects pattern data, that is, the deflection signal so as to correct the positions of the electron beam relative to the block, and controls the beam blanker 800 via an electron beam control circuit 820, emitting the electron beam 803. A control computer 817 controls the general operations of the apparatus and has stored therein pattern data to be drawn.

The feature of the electron beam exposure apparatus of the present invention resides in the provision of an imaginary mark computing unit 818 for computing the position of each of the imaginary block marks 23b1, 23b2, ... 23c1, 23c2, ... through utilization of the correction coefficients obtained from the coefficients computing circuit 816 and an imaginary mark memory 819 which stores in succession the imaginary block mark positions computed by the imaginary mark computing unit 818. With the imaginary block mark positions stored in the imaginary mark memory 819, it is possible to perform corrective positioning of the electron beam in the blocks of the inner unit belts 20b and 20c for which the real block marks 22a0, 22a1, 22a2, ... cannot be used. This permits high precision pattern alignment.

The present invention further features the computation of the correction coefficients based on three block marks. Before describing this, a method of obtaining correction coefficients based on four block marks will be described.

Figure 11:
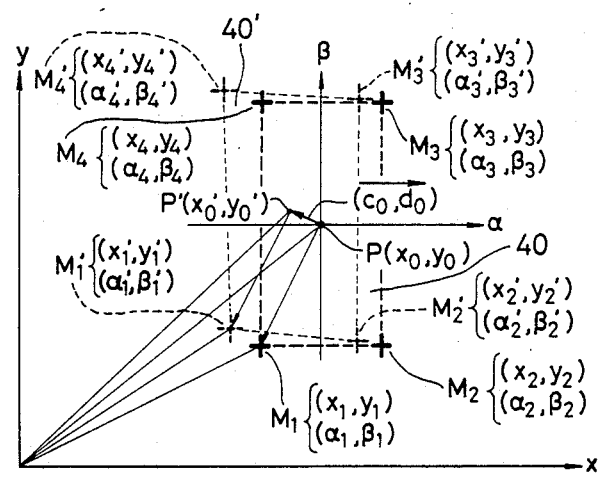
FIG. 11 is a diagram showing, by way of example, the shifts between designed block marks and detected block marks each represented by both the stage coordinates (x, y) and the block coordinates ($\alpha$, $\beta$)

Assume that as depicted in FIG. 11, positions of the four original block marks $M_1$ to $M_4$ of a block 40 and displaced block marks $M_1'$ to $M_4'$ of a distorted block 40' are represented in both (x, y)-stage coordinate system and ($\alpha$, $\beta$)-block coordinate system, which is a simple parallel translation of the former, by [($x_1$, $y_1$), ($x_2$, $y_2$), ($x_3$, $y_3$), ($x_4$, $y_4$)], [($x_1'$, $y_1'$), ($x_2'$, $y_2'$), ($x_3'$, $y_3'$), ($x_4'$, $y_4'$)], [($\alpha_1$, $\beta_1$), ($\alpha_2$, $\beta_2$), ($\alpha_3$, $\beta_3$), ($\alpha_4$, $\beta_4$)], [($\alpha_1'$, $\beta_1'$), ($\alpha_2'$, $\beta_2'$), ($\alpha_3'$, $\beta_3'$), ($\alpha_4'$, $\beta_4'$)], or generally by ($x_i$, $y_i$), ($x_i'$, $y_i'$), ($\alpha_i$, $\beta_i$), ($\alpha_i'$, $\beta_i'$), respectively, where i = 1, 2, 3, 4; the center position P of the original four block marks $M_1$ to $M_4$ defined as origin of the ($\alpha$, $\beta$)-block coordinate system and displaced center position P' are represented by ($x_0$, $y_0$) and ($x_0'$, $y_0'$), respectively, in the (x, y)-stage coordinate system; and a displacement vector from the center position P to the displaced center position P' is represented by ($c_0$, $d_0$).

The displaced center position P' of the distorted block 40' due to warping or deformation of the semiconductor wafer is represented by ($x_0+c_0$, $y_0+d_0$) in the stage coordinate system. This can also be represented by ($x_1'-\alpha_1'$, $y_1'-\beta_1'$), using the position of the detected mark $M_1'$ on the semiconductor wafer. In a similar manner, the same center position P' can be represented also by using positions of the other marks $M_2'$ to $M_4'$, thus allowing the following expressions:

$$x_0 + c_0 = x_i' - \alpha_i' \\ y_0 + d_0 = y_i' - \beta_i' \quad \quad (1)$$

where $i = 1, 2, \ldots 4$.

It has been practical to express the relationship between desired point ($\alpha$, $\beta$) on the original block 40 and a corresponding point ($\alpha'$, $\beta'$) on the distorted block 40' using the mapping function as follows:

$$\begin{bmatrix} \alpha' \\ \beta' \end{bmatrix} = \begin{bmatrix} G_1(\alpha, \beta) \\ G_2(\alpha, \beta) \end{bmatrix} \quad (2)$$

In the present case, it has been found that the terms third and higher orders of the mapping function G are negligibly small and using an approximate expression of the mapping function, the abovesaid displaced mark positions ($\alpha_i'$, $\beta_i'$) are expressed as follows:

$$\alpha_i' = G_1(\alpha_i, \beta_i) = \alpha_i + c_1 \cdot \alpha_i + c_2 \cdot \beta_i + c_3 \cdot \alpha_i\beta_i \\ \beta_i' = G_2(\alpha_i, \beta_i) = \beta_i + d_1 \cdot \alpha_i + d_2 \cdot \beta_i + d_3 \cdot \alpha_i\beta_i \quad (3)$$

where: $i = 1$ to 4.

In the above, $(c_i, d_i)_{i=1 \text{ to } 3}$ are correction coefficients, where the terms having coefficients $c_1$, $d_2$ are gain terms, having $c_2$, $d_1$ are rotatory terms, and having $c_3$, $d_3$ are trapezoidal terms. From the expressions (1) and (3) are obtained the following expressions $$x_0 + c_0 = x_i' - (a_i + c_1 \cdot \alpha_i + c_2 \cdot \beta_i + c_3 \cdot \alpha_i\beta_i)$$
$$y_0 + d_0 = y_i' - (\beta_i + d_1 \cdot \alpha_i + d_2 \cdot \beta_i + d_3 \cdot \alpha_i\beta_i)$$

which can be rewritten as $$\left.\begin{array}{l} c_0 + c_1 \cdot \alpha_i + c_2 \cdot \beta_i + c_3 \cdot \alpha_i\beta_i = x_i' - x_i \\ d_0 + d_1 \cdot \alpha_i + d_2 \cdot \beta_i + d_3 \cdot \alpha_i\beta_i = y_i' - y_i \end{array}\right\} \quad (4)$$

where, $$\left.\begin{array}{l} x_i = x_0 + \alpha_i \\ y_i = y_0 + \beta_i \end{array}\right\} \quad (5)$$

$$i = 1 \text{ to } 4$$

In the expression (4), these coefficients $(c_i, d_i)_{i=0 \text{ to } 3}$ are the correction coefficients, and these can be obtained by solving the following expression:

$$\begin{bmatrix} c_0 & d_0 \\ c_1 & d_1 \\ c_2 & d_2 \\ c_3 & d_3 \end{bmatrix} = \begin{bmatrix} 1 & \alpha_1 & \beta_1 & \alpha_1\beta_1 \\ 1 & \alpha_2 & \beta_2 & \alpha_2\beta_2 \\ 1 & \alpha_3 & \beta_3 & \alpha_3\beta_3 \\ 1 & \alpha_4 & \beta_4 & \alpha_4\beta_4 \end{bmatrix}^{-1} \begin{bmatrix} x_1' - x_1 & y_1' - y_1 \\ x_2' - x_2 & y_2' - y_2 \\ x_3' - x_3 & y_3' - y_3 \\ x_4' - x_4 & y_4' - y_4 \end{bmatrix} \quad (6)$$

Corrective positioning for a given point in the block 40 can be made using $(c_i, d_i)_{i=0 \text{ to } 3}$ obtained from the expression (6) as follows:

Substitution of the expression (5) into the expression (4) gives the following expression (7):

$$x_i' = x_0 + \alpha_i + c_0 + c_1 \cdot \alpha_i + c_2 \cdot \beta_i + c_3 \cdot \alpha_i\beta_i \quad (7)$$
$$y_i' = y_0 + \beta_i + d_0 + d_1 \cdot \alpha_i + d_2 \cdot \beta_i + d_3 \cdot \alpha_i\beta_i$$

This coordinate value $(x_i', y_i')$ is representative of the actual mark position (the stage coordinate value) but can be modified to represent an arbitrary point $(x', y')$ by substituting the block coordinate value $(\alpha_i, \beta_i)$ of the block mark $M_i$ for the corresponding arbitrary point $(\alpha, \beta)$, obtaining the following expression (8):

$$\left.\begin{array}{l} x' = x_0 + \alpha + c_0 + c_1 \cdot \alpha + c_2 \cdot \beta + c_3 \cdot \alpha\beta \\ y' = y_0 + \beta + d_0 + d_1 \cdot \alpha + d_2 \cdot \beta + d_3 \cdot \alpha\beta \end{array}\right\} \quad (8)$$

This is a basic expression for the correction of positioning and corresponds to the expression employed in the aforementioned Fujinami et al literature in IEDM 81, IEEE 1981.

Figure 12:
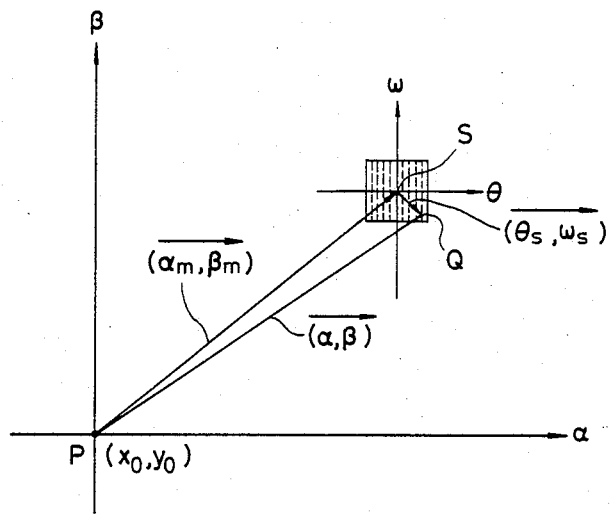
FIG. 12 is a graph showing an example of the relationship between the coordinate center ($x_0$, $y_0$) of the block and a sub-deflection system ($\theta$, $\omega$)

As indicated in FIG. 12, a deflected point Q of the electron beam can be expressed by composition of the main deflection vector $(\alpha_m, \beta_m)$ and the sub-deflection vector $(\theta_s, \omega_s)$ in the block coordinate system $(\alpha, \beta)$. Therefore, the position Q of the pattern expressed by the coordinates $(\theta_s, \omega_s)$ in the sub-deflection can be converted into the block coordinates $(\alpha, \beta)$ as follows:

$$\left.\begin{array}{l} \alpha = \alpha_m + \theta_s \\ \beta = \beta_m + \omega_s \end{array}\right\} \quad (9)$$

where $(\alpha_m, \beta_m)$ is a displacement vector of the coordinate center S of the sub-deflection system relative to the coordinate center $P(x_0, y_0)$ of the block. Substitution of the above expression (9) into the expression (8) gives $$x' = x_0 + (\alpha_m + \theta_s) + c_0 + c_1 \cdot (\alpha_m + \theta_s) + c_2 \cdot (\beta_m + \omega_s) + c_3 \cdot (\alpha_m + \theta_s) \cdot (\beta_m + \omega_s) \quad (10)$$

In view of the fact that $\beta_m$ and $\theta_s$ are given by the main deflection and the sub-deflection, respectively, it will be convenient to rearrange the above expression (10) as follows:

$$x' = a_0 + \alpha_m + c_0 + c_1 \cdot \alpha_m + c_2 \cdot \beta_m + c_3 \cdot \alpha_m\beta_m + \quad (11)$$
$$[\theta_s + (c_1 + c_3 \cdot \beta_m) \cdot \theta_s + (c_2 + c_3 \cdot \alpha_m) \cdot \omega_s + c_3 \cdot \theta_s\omega_s]$$

Therefore, $$x' = [x_0 + \alpha_m + c_0 + c_1 \cdot \alpha_m + c_2 \cdot \beta_m + c_3 \cdot \alpha_m\beta_m] +$$
$$[\theta_s + c_1' \cdot \theta_s + c_2' \cdot \omega_s + c_3' \cdot \theta_s\omega_s]$$

The same is true of y' as well which can be expressed as $$y' = [y_0 + \beta_m + d_0 + d_1 \cdot \alpha_m + d_2 \cdot \beta_m + d_3 \cdot \alpha_m\beta_m] + \quad (12)$$
$$[\omega_s + d_1' \cdot \theta_s + d_2' \cdot \omega_s + d_3' \cdot \theta_s\omega_s]$$

where $$\begin{bmatrix} c_1' = c_1 + c_3 \cdot \beta_m \\ c_2' = c_2 + c_3 \cdot \alpha_m \\ c_3' = c_3 \\ d_1' = d_1 + d_3 \cdot \beta_m \\ d_2' = d_2 + d_3 \cdot \alpha_m \\ d_3' = d_3 \end{bmatrix}$$

Accordingly, when substituting the designed electron beam irradiation position $(\alpha, \beta)$, the first terms on the right side of the expressions (11) and (12) can be used for controlling the main deflection of the electron beam and the second terms can be used for controlling the sub-deflection of the electron beam, thus providing corrected position $(x', y')$ of the electron beam.

Next, a description will be given, with reference to FIG. 13, of the correction of the electron beam positioning through utilization of three block marks.

Its basic concept is identical with that of the above method utilizing four block marks. This method differs from the above in that the trapezoidal coefficients $c_3$, $d_3$ are disregarded and only the offset coefficient $c_0$, $d_0$, gain coefficients $c_1$, $d_2$) and the rotation coefficients $c_2$, $d_1$ are employed. Therefore, the expression for the correction of positioning, in which the terms for $c_3$ and $d_3$ in the expression (8) are made zero, is given as follows:

$$x' = x_0 + \alpha + c_0 + c_1 \cdot \alpha + c_2 \cdot \beta \quad (13)$$
$$y' = y_0 + \beta + d_0 + d_1 \cdot \alpha + d_2 \cdot \beta$$

The expression (13) can be further modified as follows using the expression (9).

$$\begin{aligned}x' &= (x_0 + \alpha_m + c_0 + c_1 \cdot \alpha_m + c_2 \cdot \beta_m) + \\ &\quad (\theta_s + c_1 \cdot \theta_s + c_2 \cdot \omega_s) \\ y' &= (y_0 + \beta_m + d_0 + d_1 \cdot \alpha_m + d_2 \cdot \beta_m) + \\ &\quad (\omega_s + d_1 \cdot \theta_s + d_2 \cdot \omega_s)\end{aligned} \quad (14)$$

The above expression (14) indicates that for a designed pattern data ($\alpha$, $\beta$), that is, ($\alpha_m + \theta_s$, $\beta_m + \omega_s$), the first terms in the expressions (14) are given as corrected main deflection signal data and the second terms are given as corrected sub-deflection signal data, thus achieving the positioning of the electron beam to a corrected point (x', y').

The correction coefficients $(c_i, d_i)_{i=0 \text{ to } 2}$ can be obtained by performing the following matrix operation:

$$\begin{bmatrix} c_0 & d_0 \\ c_1 & d_1 \\ c_2 & d_2 \end{bmatrix} = \begin{bmatrix} 1 & \alpha_1 & \beta_1 \\ 1 & \alpha_2 & \beta_2 \\ 1 & \alpha_3 & \beta_3 \end{bmatrix}^{-1} \begin{bmatrix} x_1' - x_1 & y_1' - y_1 \\ x_2' - x_2 & y_2' - y_2 \\ x_3' - x_3 & y_3' - y_3 \end{bmatrix} \quad (15)$$

Figure 13:
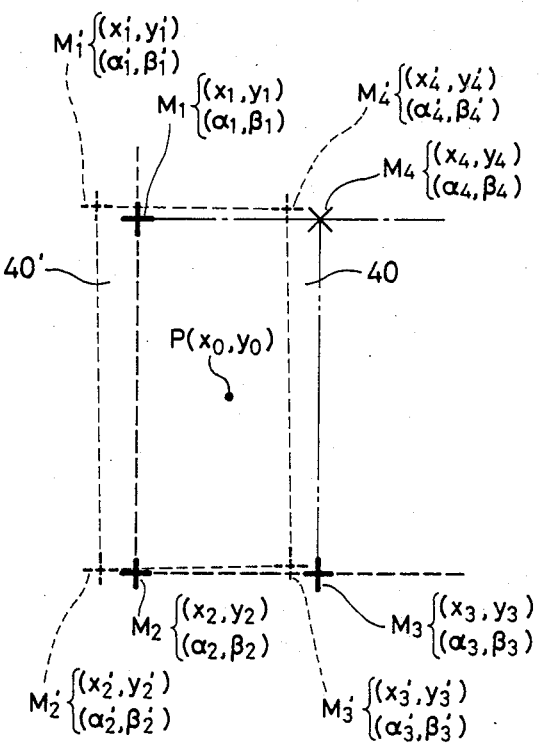
FIG. 13 is a diagram showing the relationship of the block, three-block marks $M_1$, $M_2$, $M_3$, ... and the center P of the block.

That is, using three $M_1$, $M_2$, $M_3$ of actual block mark(s) and/or corrected imaginary block mark(s) at three corners of a block as shown in FIG. 13, the correction coefficients $c_i$, $d_i$ can be obtained for the block. Letting $(x_i', y_i')$ be the actual block mark position (the stage coordinate value) and letting $(x_i, y_i)_{i=1, 2, 3}$ be the stage coordinate value of the corresponding designed block mark $M_i$ centering about the origin $P(x_0, y_0)$, as is the case with the above, $x_i$ and $y_i$ can be obtained from the following expression:

$$\begin{aligned} x_i &= x_0 + \alpha_i \\ y_i &= y_0 + \beta_i \end{aligned}$$

By using the correction coefficients thus obtained, the coordinate value of a given position ($\alpha$, $\beta$) in the block 40 can also be corrected. Further, by substituting the coordinate value ($\alpha_4$, $\beta_4$) of the designed imaginary mark $M_4$, for $\alpha$ and $\beta$ in the expression (13), a corrected coordinate value ($x_4'$, $y_4'$) of the imarginary mark $M_4'$ can be obtained. In general, the corrected imaginary mark position ($x_i'$, $y_i'$) can be obtained from the following expression which is obtained from the expression (7) where $c_3$ and $d_3$ are made zero.

$$\begin{aligned} x_i' &= x_0 + \alpha_i + c_0 + c_1 \cdot \alpha_i + c_2 \cdot \beta_i \\ y_i' &= y_0 + \beta_i + d_0 + d_1 \cdot \alpha_i + d_2 \cdot \beta_i \end{aligned} \quad (16)$$

Figure 14:
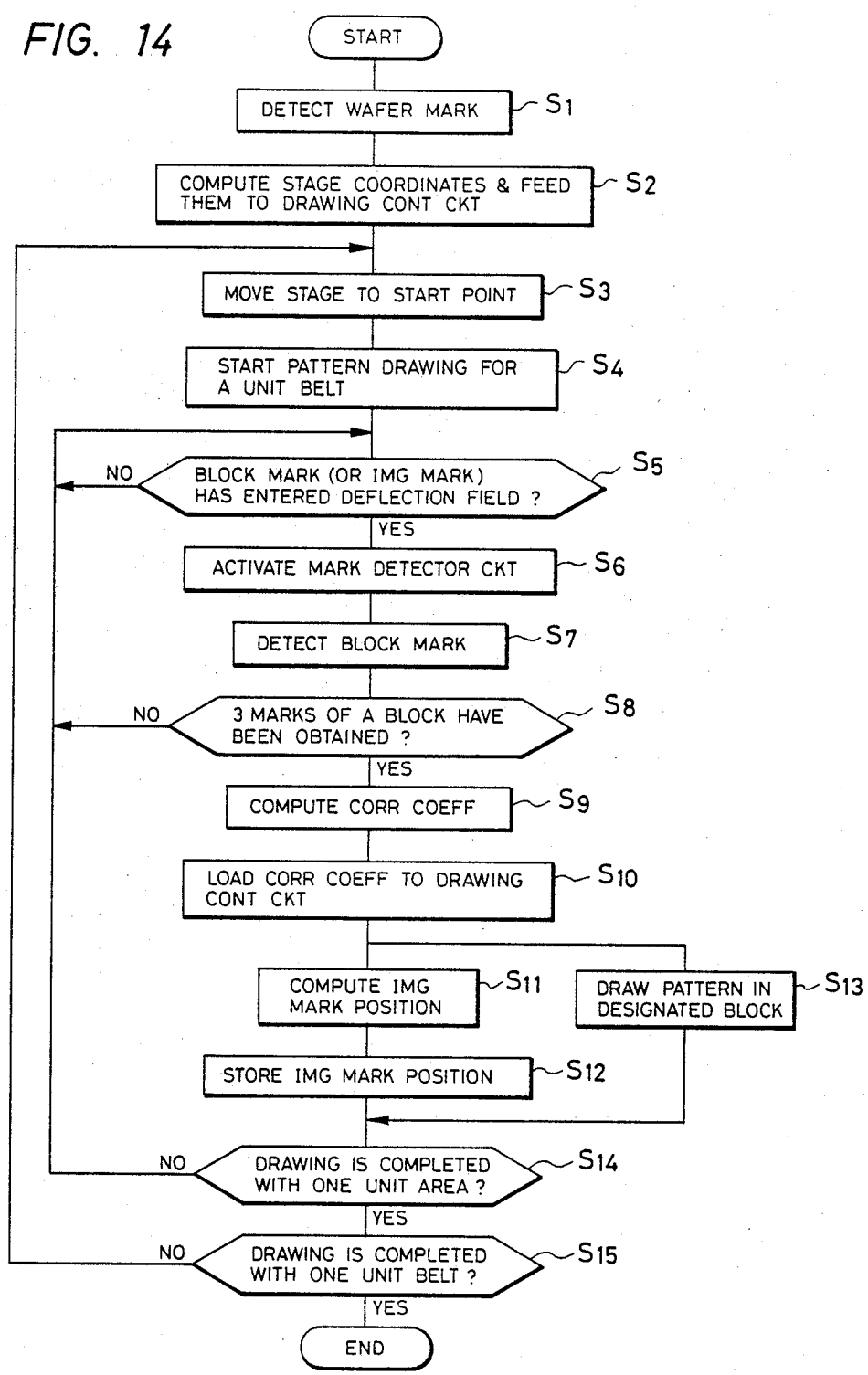
FIG. 14 is a flowchart showing the flow of the operation of the apparatus illustrated in FIG. 10.

Next, a description will be given, with reference to FIG. 14, of the flow of the whole operation. The operation begins with the detection of the wafer marks 120-1 and 120-2 (step $S_1$). On the basis of the positions of the wafer marks 120-1 and 120-2 in the coordinate system on the stage, the position of each block mark in the stage coordinate system is calculated and the calculated value is provided to the drawing control circuit 811 (step $S_2$). The stage 806 is moved to the start point, as shown in FIG. 4 (step $S_3$), after which pattern drawing in the unit belt is initiated and at the same time, the stage 806 is continuously fed in the direction of the arrow 105 (step $S_4$). It is monitored by the laser distance gauge 808 whether a predetermined distance has been traveled to assure that a block mark (or imaginary block mark) has entered the deflection field 204 (step $S_5$) If yes, the mark detection circuit 815 is activated (step $S_6$), and upon detection of the block mark (step $S_7$), it is checked whether three block marks of one block have been obtained (step $S_8$) If not, the operation returns to step $S_5$. When the three block marks have all been obtained, correction coefficients are computed in the coefficients computing unit 816 pursuant to the expression (15) (step $S_9$) If an imaginary block mark is needed, the required imaginary block mark is input into the coefficients computing circuit 816 via the drawing control circuit 811 from the imaginary mark memory 819. The correction coefficients thus obtained are provided to the drawing control circuit 811 and the imaginary mark computing unit 818 (step $S_{10}$). The imaginary mark computing unit 818 computes the position of the imaginary block mark by operating the expression (15), using the correction coefficients (step $S_{11}$), and stores the imaginary mark position in the imaginary mark memory 819 (step $S_{12}$) On the other hand, the drawing control circuit 811 corrects pattern data on the basis of the correction coefficients supplied thereto and performs pattern drawing in the block concerned (step $S_{13}$) It is checked whether or not the computation of the positions of imaginary block marks and the pattern drawing for one unit belt have been completed (step $S_{14}$); if not, the operation returns to the step $S_5$, and if yes, then it is checked whether or not the computation of the positions of imaginary block marks and the pattern drawing in one unit area have been finished (step $S_{15}$), and if not, the operation returns to the step $S_3$.

As described above, according to the present invention, the setting and storage of the positions of imaginary block marks make it possible to perform pattern drawing using corrected pattern data even for the inner blocks $bc_2$, $bc_3$, ... in the chip area (see FIG. 5) and to make the block area, i.e. the deflection field 204 of the electron beam sufficiently smaller than the chip area 10, for example, 1/16 of the chip area 10. This allows the reduction of the deflection width of the main deflector 804 and hence diminishes the deflection distortion and the aberration, ensuring enhancement of the pattern drawing precision. Moreover, it is possible to perform the corrective positioning while at the same time setting the positions of imaginary block marks and to effect the pattern drawing in small blocks while continuously feeding the specimen at the same time. This reduces the time for positioning and hence permits efficient pattern drawing. Therefore, according to the present invention, patterns of high density semiconductor integrated circuits can be exposed in a short time.

As will be appreciated from the above, the first feature of the present invention lies in the setting of imaginary block marks. With this, even in the case of a chip area for which real block marks cannot be provided at short intervals, the correction, coefficients can be obtained for each of smaller blocks into which the chip area is divided, thus allowing less alignment in pattern exposure. In this instance, the pattern exposure may also take place after the setting of imaginary block marks and the computation of correction coefficients for all the blocks.

The specimen may also be fed intermittently, instead of continuously as in the above, in such a manner that the imaginary block mark is set and the correction coefficients are computed for each block and the specimen is stopped for pattern exposure in that block. In this case, the length of the deflection field 204 in the direction of travel of the specimen needs only to be slightly larger than the length of the block in the same direction. In the case of continuously feeding the specimen at a fixed speed, as will be seen from the description given previously in connection with FIGS. 6 through 8, it is necessary only that pattern exposure for the block concerned is completed until the block passes through the deflection field 204 after the setting of the imaginary block mark for the block, and the length of the deflection field 204 in the direction of travel of the specimen may be smaller than twice the length of the block in that direction. The coefficients computing circuit 816 and the imaginary mark computing unit 818 may each be provided in the form of independent hardware or may also be included in the drawing control circuit 811.

Moreover, the present invention is applicable not only to pattern exposure for a semiconductor wafer but also to pattern exposure in the case where difficulty is encountered in providing real block marks in a matrix form for correction of positioning. Besides, the present invention can be applied to pattern exposure which employs a charged particle beam other than the electron beam.

It will be apparent that many modifications and variations may be effected without departing from the scope of the novel concepts of the present invention.

What is claimed is:

1. A charged particle beam exposure method for exposing patterns by applying a charged particle beam, through deflection control, to one surface of a specimen on which rectangular blocks are defined in and real block marks are provided on at least two adjoining sides of the block matrix to define rows and columns thereof, said method comprising the steps of:
    (a) passing the specimen through a charged particle beam deflection field along one of the two sides of the block matrix so that a first block in a first row at an intersection of two adjoining sides enters the charged particle beam deflection field;
    (b) detecting the real block marks having entered the charged particle beam deflection field;
    (c) detecting three real block marks at three corners of the first block;
    (d) computing correction coefficients based on the positions of the three detected real block marks;
    (e) placing an imaginary block mark at the one remaining corner of the first block on the basis of the computed correction coefficients;
    (f) detecting the real block mark of each of the subsequent blocks;
    (g) computing correction coefficients based on the position of the newly detected real block mark, the position of the real block mark detected for the immediately preceding block, and the position of the imaginary block mark placed at the one remaining corner of the immediately preceding block;
    (h) placing an imaginary block mark at the remaining corner of the subsequent block on the basis of the computed correction coefficients;
    (i) correcting pattern data for each of the blocks according to the correction coefficients computed therefor; and
    (j) drawing a pattern with the charged particle beam in each block in accordance with the corrected pattern data.

2. The method according to claim 1, wherein said step (j) of drawing the pattern is carried out for each block after obtaining correction coefficients and setting the imaginary block marks for all the blocks of each row.

3. The method according to claim 1, further comprising the steps of:
    (k) storing the positions of the imaginary block marks set for the respective blocks in an imaginary block mark memory means;
    (l) passing a second row of the blocks through the charged particle beam deflection field, the second row of blocks, which is set immediately inside the first row, having real block marks at two corners of a block at one end of the second row and having imaginary block marks along one side which have already been set for the first row of blocks;
    (m) positioning and detecting the two real block marks of the block at one end of the second row in the charged particle beam deflection field;
    (n) computing correction coefficients for the block at one end of the second row based on the positions of the two detected real block marks and the position of the already set imaginary block mark;
    (o) placing an imaginary block mark at one remaining corner of the block at one end of the second row on the basis of the computed correction coefficients;
    (p) computing correction coefficients for the next block in the second row based on the imaginary block marks already set at three corners thereof; and
    (q) performing, in succession, the computation of the correction coefficients and the setting of imaginary block marks for subsequent blocks of the second row.

4. The method according to claim 3, wherein the specimen is a semiconductor wafer for the formation thereon of an integrated circuit and the semiconductor wafer has, on its one surface, a plurality of chip areas set in rows and columns, each chip area being divided into the blocks arrayed in matrix form.

5. The method according to claim 4, wherein said step (j) of drawing the pattern is performed for each block after computing the correction coefficients and setting the imaginary block marks for the block.

6. The method according to claim 5, wherein the charged particle beam deflection field is slightly larger than each block and further comprising the step of intermittently feeding the specimen for each block.

7. The method according to claim 5, wherein the charged particle beam deflection field is slightly larger than each block in a direction perpendicular to the direction of travel of the speimen and larger than each block in the direction of travel of the specimen at least by a length traveled by the specimen during the time required for said step (j) of drawing the pattern in the block after said step (c) of detecting three real and/or imaginary block marks of the block, and further comprising the step of continuously feeding the specimen for each row of blocks.

8. The method according to claim 7 wherein the length of the charged particle beam deflection field in the direction of travel of the specimen is approximately twice the length of each block in that direction.

9. A charged particle beam exposure apparatus comprising:
- a stage for carrying a specimen having a surface to be exposed on which rectangular blocks are defined in matrix form and real block marks are provided on at least two adjoining sides of the block matrix to define rows and columns of the matrix, said stage being capable of feeding the specimen in row and column directions of the block matrix;
- deflection means for deflecting a charged particle beam to a desired point on the surface of the specimen mounted on said stage;
- mark detection means for detecting the real block marks present in a deflection field of the charged particle beam through detection of electrons reflected from the real block marks irradiated with the charged particle beam;
- coefficient computing means for computing correction coefficients on the basis of the positions of the three real and/or imaginary block marks at three corners of one block;
- imaginary mark computing means for setting an imaginary block mark at one remaining corner of the block on the basis of the correction coefficients computed by said coefficient computing means;
- imaginary block mark memory means for storing the positions of the imaginary block marks computed by said imaginary block mark computing means; and
- drawing control means for correcting paattern data on the basis of the correction coefficients computed by said coefficient computing means and supplying the corrected pattern data to said deflection means, thereby deflecting the charged particle beam by said deflection means in accordance with the corrected pattern data, and irradiating the specimen surface with the charged particle beam.

10. The apparatus according to claim 9, further comprising distance gauge means which measures the distance of travel of the specimen carried by said stage and obtaining the position of the block mark at the time of detection by said mark detection means.

11. The apparatus according to claim 9, wherein said deflection means comprises:
- main deflection means for deflecting the charged particle beam over a field larger in area than each block; and
- sub-deflection means for deflecting the charged particle beam over a field sufficiently smaller in area than the deflection field by said main deflection means.

* * * * *

UNITED STATES PATENT AND TRADEMARK OFFICE
CERTIFICATE OF CORRECTION

PATENT NO. : 4,789,945
DATED : DECEMBER 6, 1988
INVENTOR(S) : HIRONOBU NIIJIMA

It is certified that error appears in the above-identified patent and that said Letters Patent is hereby corrected as shown below:

FRONT PAGE, [57] ABSTRACT, line 3, delete "of".

Col. 3, line 1, "acounts" should be --accounts--;
        line 66, "vertually" should be --virtually--.

Col. 6, line 58, "tlock" should be --block--;
        line 66, "coe-fficients" should be --coefficients--.

Col. 7, line 47, "iro" should be --for--.

Col. 8, line 44, "real-block-marks" should be --real block marks--.

Col. 12, line 16, "$\beta_m$" should be --$\alpha_m$--.

Col. 14, line 8, after "$S_8$)" insert a period;
         line 12, after "$S_9$)" insert a period;
         line 27, after "$S_{13}$)" insert a period.

Signed and Sealed this

Sixteenth Day of May, 1989

Attest:

DONALD J. QUIGG

Attesting Officer

Commissioner of Patents and Trademarks